US007027338B2

(12) United States Patent
Lee et al.

(10) Patent No.: US 7,027,338 B2
(45) Date of Patent: Apr. 11, 2006

(54) SEMICONDUCTOR MEMORY DEVICE WITH SHIFT REDUNDANCY CIRCUITS

(75) Inventors: Chan-Ho Lee, Osan (KR); Jeung-Joo Lim, Yongin (KR); Eun-Kyoung Lim, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 152 days.

(21) Appl. No.: 10/631,766

(22) Filed: Aug. 1, 2003

(65) Prior Publication Data

US 2004/0027863 A1 Feb. 12, 2004

(30) Foreign Application Priority Data

Aug. 8, 2002 (KR) ...................... 10-2002-0046919

(51) Int. Cl.
*G11C 7/00* (2006.01)
(52) U.S. Cl. .................................... 365/200; 365/225.7
(58) Field of Classification Search ................ 365/200, 365/225.7
See application file for complete search history.

(56) References Cited

U.S. PATENT DOCUMENTS

| 5,146,429 | A | * | 9/1992 | Kawai et al. | ................ | 365/200 |
| 5,608,685 | A | * | 3/1997 | Johnson et al. | ........ | 365/230.06 |
| 5,933,376 | A | * | 8/1999 | Lee | ............. | 365/200 |
| 6,021,075 | A | * | 2/2000 | Ueno | ......... | 365/200 |
| 6,765,832 | B1 | * | 7/2004 | Ohtani | ....... | 365/200 |

* cited by examiner

*Primary Examiner*—Son Mai
(74) *Attorney, Agent, or Firm*—Harness, Dickey & Pierce, P.L.C.

(57) ABSTRACT

A semiconductor memory device including a shift redundancy circuit with two buffer chains, two fuses connected to the shift redundancy circuit, a plurality of fuse cut-out detecting circuits for detecting cut-out status of the fuses, and two spare cell control circuits for controlling two spare memory cell rows, wherein word line control signals for controlling corresponding word lines connected to memory cells in a memory cell array are shifted upward and downward to control respective next word lines, thereby replacing two defective memory cell rows with the two spare memory cell rows.

11 Claims, 6 Drawing Sheets

SEMICONDUCTOR MEMORY DEVICE WITH SHIFT REDUNDANCY CIRCUITS

CROSS-REFERENCE TO RELATED APPLICATIONS

This U.S. nonprovisional patent application claims priority under 35 U.S.C. § 119 of Korean Patent Application 2002-46919 filed on Aug. 8, 2002, the entire contents of which are hereby incorporated by reference.

BACKGROUND OF THE INVENTION

1. Field of the Invention

The present invention relates to a semiconductor memory device, and more particularly to a semiconductor memory device having shift redundancy circuits.

2. Description of the Related Art

Semiconductor memory devices may have defective memory cell rows that can hinder the operation of the memory device and hence are undesirable. In the case where a defective memory cell row is present in a memory cell array, instead of controlling its corresponding word line, a word line control signal controls the respective next word line by being sequentially shifted in a direction, downward or upward. In conventional semiconductor memory devices, the word line selections are shifted in only one direction, upward or downward. Accordingly, in the case that a semiconductor memory device has two or more defective memory cell rows in a memory cell array, such semiconductor memory device may not be repairable. That is, conventional semiconductor memory devices are designed so that only one defective memory cell row can be repaired.

FIG. 1 is a schematic block diagram of a conventional semiconductor memory device. Referring to FIG. 1, a conventional semiconductor memory device includes a row decoder 10, a fuse circuit block 20, a shift redundancy circuit block 30, a fuse cut-out detecting circuit block 40, and a memory cell array 50.

The fuse circuit block 20 includes fuses f1 to fn which are serially connected. The semiconductor memory device shown in FIG. 1 has one spare memory cell row. Word lines R1 to Rn connected to memory cells are shifted through corresponding transmission gates T1a to Tna, T1b to Tnb. NMOS transistors Q1, Q2a to Qna, Q2b to Qnb connected to the corresponding word lines R1 to Rn are used to disable the corresponding word lines R1 to Rn having at least one defective memory cell. An output of the row decoder 10 is used as an input of a next memory cell row which is near the corresponding memory cell row in the downward direction as well as an input of the corresponding memory cell row.

Each fuse f1 to fn has an end connected to a power supply voltage Vcc and the other end connected to a ground voltage Vss. Since the fuses f1 to fn are connected between the power supply voltage Vcc and the ground voltage Vss, in the case that the memory cell array 50 does not have a defective memory cell row, the power supply voltage may be supplied to the shift redundancy circuit block 30. Accordingly, the transmission gates Tia ("i" is an integer) are turned on and the transmission gates Tib are turned off, so that the word lines R1 to Rn are connected to corresponding memory cell rows in the memory cell array 50. That is, the word lines R1 to Rn are not shifted. Further, the last transmission gate Tnb is turned off and the NMOS transistor Qn+1 connected to a spare word line Rn+1 is turned on, so that the spare word line Rn+1 is disabled.

On the other hand, in the case that the memory cell array 50 has a defective memory cell row, the fuse corresponding to the defective memory cell row is cut out and shift redundancy circuits in the shift redundancy circuit block 30 are divided into two groups, a group receiving power supply voltage Vcc and a group receiving ground voltage Vss.

The shift redundancy circuits in the group receiving power supply voltage Vcc act as normal shift redundancy circuits, so that the word lines are not shifted. However, for the shift redundancy circuits in the group receiving ground voltage Vss, since the fuses are connected to the ground voltage Vss, the transmission gate Tia is turned off and the transmission gate Tib is turned on, so that the word lines are shifted. That is, assuming that there is a defective memory cell row, a transmission gate corresponding to the defective memory cell row is turned off, and a word line corresponding to the defective memory cell row is disabled by NMOS transistors Qia, Qib, so that the word line is shifted down by one row. As a result, a spare memory cell row positioned at the lowermost portion of the memory cell array 50 is used.

However, the conventional semiconductor memory device as described above is disadvantageous in that repairing efficiency is low when the semiconductor memory device has two or more spare memory cell rows. That is, since the word lines in the conventional semiconductor memory device are shifted in only one direction, upward or downward, even if two spare memory cell rows are provided to the semiconductor memory device, two defective memory cell rows can not be repaired when the two defective rows are presented in the same memory cell array block. Further, the conventional semiconductor memory device as shown in FIG. 1 is disadvantageous in that there is a leakage current caused by fuse resistance, and further the semiconductor memory device may malfunction due to the voltage drop when the series of fuses is long and the resistance of each fuse is high.

SUMMARY OF THE INVENTION

Exemplary embodiments of the present invention provides a semiconductor memory device with shift redundancy circuits capable of repairing two or more defective memory cell rows in a memory cell array block. Exemplary embodiments of the present invention provide a method for locating the spare memory cell rows when one or more spare memory cell rows exist. An exemplary embodiment of the present invention, is directed to a semiconductor memory device comprising at least two shift redundancy circuits with at least two buffer chains, at least two fuses connected to each of the shift redundancy circuits, at least two fuse cut-out detecting circuits connected to each of the shift redundancy circuits for detecting cut-out status of the fuses, and at least two spare cell control circuits for controlling at least two spare memory cell rows, wherein word line control signals for controlling corresponding word lines connected to memory cells in a memory cell array are shifted upward or downward, thereby replacing at least two defective memory cell rows with the at least two spare memory cell rows.

Another exemplary embodiment of the present invention provides a semiconductor memory device with first to n-th shift redundancy circuits, including: a row decoder for generating a plurality of word line control signals; a plurality of shift redundancy circuits for receiving at least three word line control signals of the word line control signals, and transmitting at least one word line control signal among the received three word line control signals; a plurality of upper fuses and a plurality of lower fuses, each being connected between a power supply voltage and a corresponding shift redundancy circuit; a plurality of upper and lower fuse cut-out detecting circuits reset by a reset signal, each of which receives an output of either a corresponding upper fuse or a corresponding lower fuse, and enables or disables respective outputs of the corresponding shift redundancy circuits; a first spare cell control circuit for receiving a first word line control signal and a third output signal of the first shift redundancy circuit, and generating a first spare cell control signal; a second spare cell control circuit for receiving an n-th word line control signal and a second output signal of the n-th shift redundancy circuit, and generating a second spare cell control signal; and a plurality of inverters, each connected to a respective output terminal of the corresponding shift redundancy circuit and connected to an output terminal of the first and second spare cell control circuits, for inverting voltage levels of the output terminals and outputting corresponding final word line control signals.

In an exemplary embodiment, an n−1-th shift redundancy circuit of the shift redundancy circuits in the semiconductor memory device may include: a first transmission switch for receiving an n-th shift word line control signal in response to the third output signal of the n-th shift redundancy circuit and transmitting the n-th shift word line control signal to a first node; a third transmission switch for receiving an n−2-th word line control signal while being controlled by the second output signal of the n−2-th shift redundancy circuit and transmitting the received n−2-th word line control signal to the first node; a downward buffer chain for receiving a third output signal of the n-th shift redundancy circuit and an output signal of the upper fuse, logically multiplying the received signals, and outputting a result of the logical multiplication operation as a third output signal of the n−1-th shift redundancy circuit; an upward buffer chain for receiving a second output signal of the n−2-th shift redundancy circuit and an output signal of the lower fuse, logically multiplying the received signals and outputting a result of the logical multiplication operation as a second output signal of the n−1-th shift redundancy circuit; a first NAND circuit for receiving the third output signal of the n−1-th shift redundancy circuit and the second output signal of the n−1-th shift redundancy circuit, NANDing the received signals and transmitting a result of the NAND operation to a control node of a second transmission switch; and the second transmission switch for receiving an n−1-th word line control signal while being controlled by an output of the first NAND circuit and transmitting the received n−1-th word line control signal to the first node.

In an exemplary embodiment, an n−1-th upper fuse cut-out detecting circuit of the plurality of fuse cut-out detecting circuits in the semiconductor memory device may include: an eighth PMOS transistor having a gate electrode to which an output signal of an n−1-th upper fuse is applied, a source electrode to which a power supply voltage is applied and a drain electrode from which an output signal of the detecting circuit is generated; a sixth NMOS transistor having a drain electrode connected to a gate electrode of the eighth PMOS transistor and a source electrode connected to a ground voltage, wherein the sixth NMOS transistor performs switching operations in response to a reset signal, and a latch circuit connected between the gate electrode of the eighth PMOS transistor and the ground voltage for keeping a voltage level of the gate electrode of the eighth PMOS transistor with logic "low" when the output signal of the n−1-th upper fuse has a logic "low" level.

In an exemplary embodiment, an n−1-th lower fuse cut-out detecting circuit of the lower fuse cut-out detecting circuits in the semiconductor memory device may include: a ninth PMOS transistor having a gate electrode to which an output signal of an n−1-th lower fuse is applied, a source electrode to which a power supply voltage is applied, and a drain electrode from which an output signal of the detecting circuit is generated, an eighth NMOS transistor having a drain electrode connected to the gate electrode of the ninth PMOS transistor and a source electrode to which a ground voltage is applied, wherein the eighth NMOS transistor performs switching operations in response to a reset signal, and a latch circuit connected between the gate electrode of the ninth PMOS transistor and the ground voltage for keeping a voltage level of the gate electrode of the ninth PMOS transistor with logic "low" when the output signal of the n−1-th lower fuse has a logic "low" level.

In an exemplary embodiment, the first spare cell control circuit in the semiconductor memory device may include: a first transmission gate being comprised of a first PMOS transistor and a first NMOS transistor, for receiving the first word line control signal by being controlled by the third output signal of the first shift redundancy circuit, the third output signal being input to a gate electrode of the first PMOS transistor, and transmitting the first word line control signal to an output node of the first spare cell control circuit; a first inverter for inverting a voltage level of the gate electrode of the first PMOS transistor and applying the inverted voltage level to a gate electrode of the first NMOS transistor; and a third PMOS transistor connected between the output node of the first spare cell control circuit and a power supply voltage, and having a gate electrode connected to the gate electrode of the first NMOS transistor.

In an exemplary embodiment, the second spare cell control circuit in the semiconductor memory device may include: a second transmission gate being comprised of a second PMOS transistor and a second NMOS transistor, for receiving the n-th word line control signal while being controlled by the second output signal of the n-th shift redundancy circuit, wherein the second output signal is input to a gate electrode of the second PMOS transistor, and transmitting the received n-th word line control signal to an output node of the second spare cell control circuit; a second inverter for inverting a voltage level of the gate electrode of the second PMOS transistor and transmitting the inverted voltage level to a gate electrode of the second NMOS transistor; and a fourth PMOS transistor connected between the output node of the second spare cell control circuit and a power supply voltage, and having a gate electrode connected to the gate electrode of the second NMOS transistor.

Another exemplary embodiment of the present invention provides a semiconductor memory device with two spare memory cell rows and at least one defective memory cell row, wherein when the semiconductor memory device has one defective memory cell row, a first spare memory cell row of the two spare memory cell rows is positioned at a lowermost portion of a memory cell array and a second spare memory cell row is positioned at an uppermost portion of the memory cell array, and wherein word line control signals are shifted upward or downward to control corresponding previous or subsequent word lines by cutting out an upper fuse or a lower fuse corresponding to the defective memory cell row.

In an exemplary embodiment, when the semiconductor memory device has two defective memory cell rows including a first defective memory cell row and a second defective memory cell row, the first defective memory cell row positioned at a lower portion of the memory cell array is replaced with the first spare memory cell row by cutting out the upper fuse corresponding to the first defective memory cell row, and the second defective memory cell row position at an upper portion of the memory cell array is replaced with the second spare memory cell row by cutting out the lower fuse corresponding to the second defective memory cell row.

Another exemplary embodiment of the present invention provides a semiconductor memory device, comprising: a memory cell array with at least two spare memory cell rows; wherein when the semiconductor memory device has two spare memory cell rows, a spare memory cell row of the two spare memory cell rows is positioned at a lowermost portion of the memory cell array in the semiconductor memory device and the other of the two spare memory cell rows is positioned at an uppermost portion of the memory cell array, when semiconductor memory device has three spare memory cell rows, a spare memory cell row of the three spare memory cell rows is positioned at the lowermost portion of the memory cell array in the semiconductor memory device, another of the three spare memory cell rows is positioned at the uppermost portion of the memory cell array, and a third of the three spare memory cell rows is positioned in a middle portion of the memory cell array, and when the semiconductor memory device has four spare memory cell rows, a spare memory cell row of the four spare memory cell rows is positioned at the lowermost portion of the memory cell array in the semiconductor memory device, another of the four spare memory cell rows is positioned at the uppermost portion of the memory cell array, and the other two of the four spare memory cell rows are adjacent to each other and positioned in the middle portion of the memory cell array.

Another exemplary embodiment of the present invention provides a semiconductor memory device, comprising: a memory cell array with N (where N is an integer >1) spare memory cell rows; wherein a first spare memory cell row of the N spare memory cell rows is positioned at a lowermost portion of the memory cell array in the semiconductor memory device, a second of the N spare memory cell rows is positioned at an uppermost portion of the memory cell array, and any remaining spare memory cell rows of the N spare memory cell rows are positioned in a middle portion of the memory cell array; wherein if N defective memory cell rows in the memory cell array divide the memory cell array into N+1 memory cell array blocks, all N defective memory cell rows can be repaired as long as no more than N−1 defective memory cell rows occur in the same memory cell array block.

Another exemplary embodiment of the present invention provides a method of repairing N (where N is an integer >1) memory cell rows in a memory cell array, comprising: providing N spare memory cell rows in the memory cell array, arranged such that a first spare memory cell row of the N spare memory cell rows is positioned at the lowermost portion of the memory cell array in the semiconductor memory device, a second of the N spare memory cell rows is positioned at an uppermost portion of the memory cell array, and any remaining spare memory cell rows of the N spare memory cell rows are positioned in a middle portion of the memory cell array; wherein the N defective memory cell rows in the memory cell array divide the memory cell array into N+1 memory cell array blocks; and repairing all N defective memory cell rows as long as no more than N−1 defective memory cell rows occur in the same memory cell array block.

BRIEF DESCRIPTION OF THE DRAWINGS

Exemplary embodiments of the present invention will be more clearly understood from the following detailed description taken in conjunction with the accompanying drawings, in which.

DETAILED DESCRIPTION OF EXEMPLARY EMBODIMENTS

Figure 1:
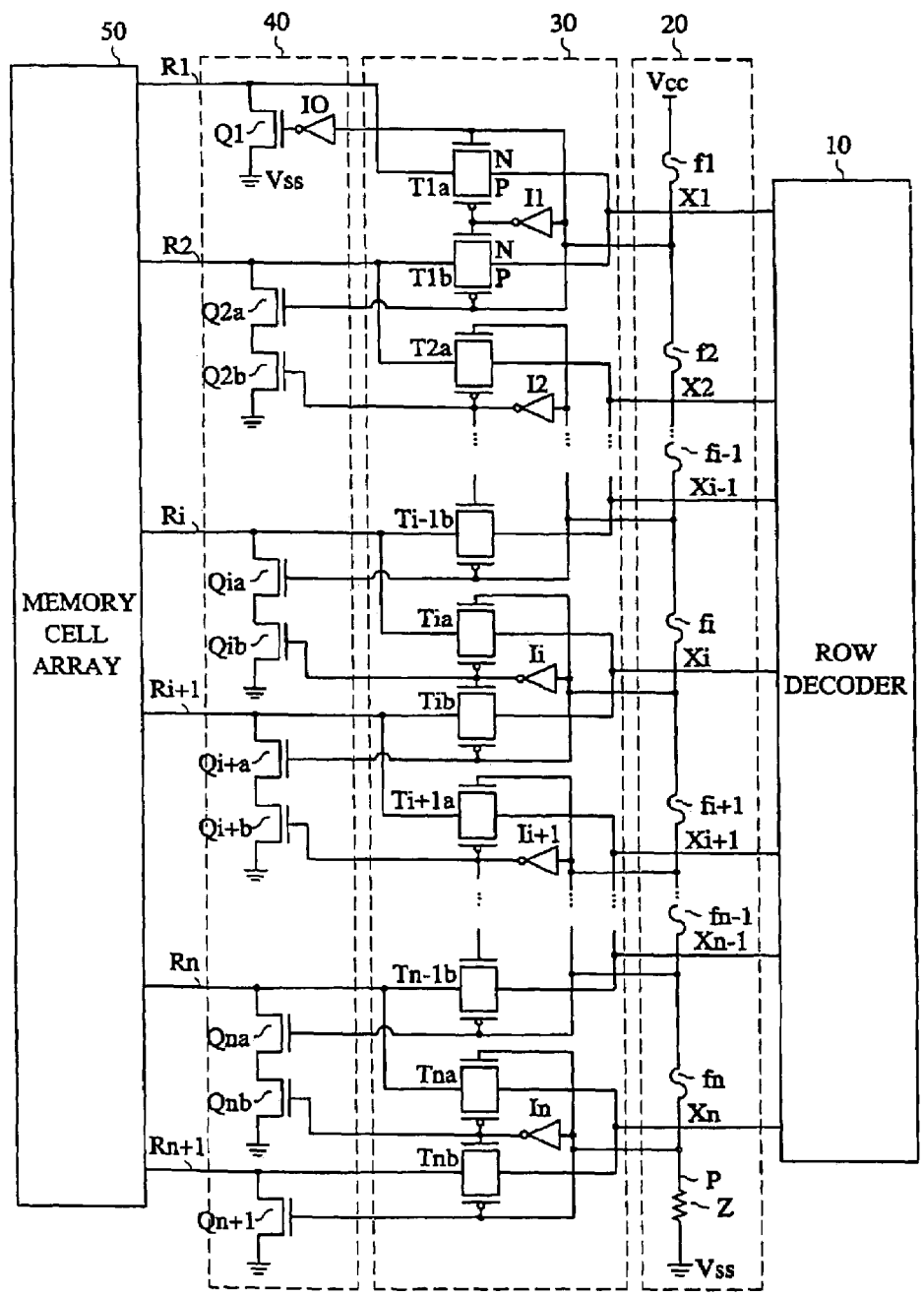
FIG. 1 is a schematic block diagram of a conventional semiconductor memory device.
Figure 2:
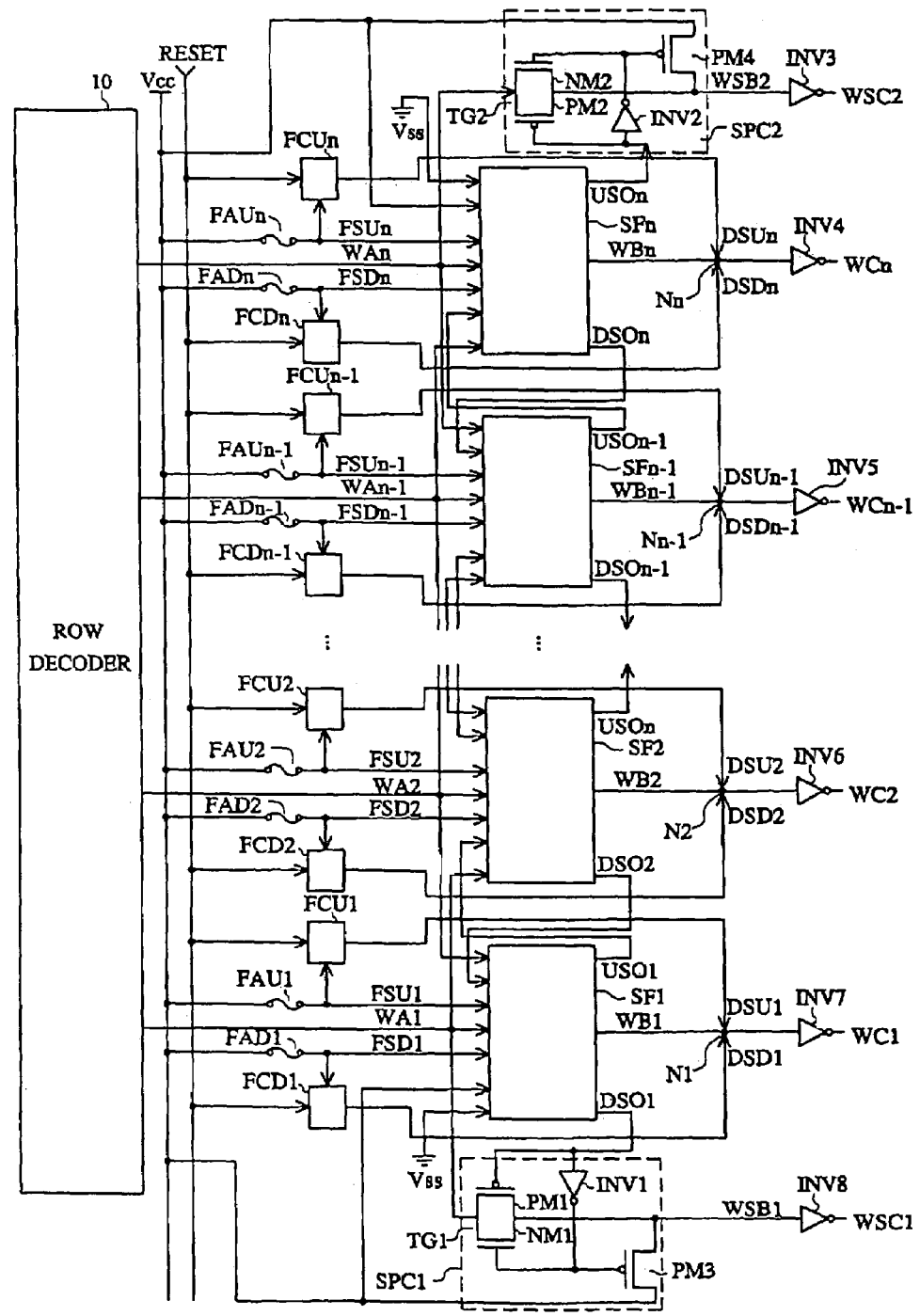
FIG. 2 is a schematic block diagram of a semiconductor memory device in accordance with an exemplary embodiment of the present invention.

FIG. 2 is a schematic block diagram of a semiconductor memory device in accordance with an exemplary embodiment of the present invention. Referring to FIG. 2, a semiconductor memory device in accordance with an exemplary embodiment of the present invention includes a row decoder 10, upper fuses FAU1 to FAUn, lower fuses FAD1 to FADn, shift redundancy circuits SF1 to SFn, upper fuse cut-out detecting circuits FCU1 to FCUn, lower fuse cut-out detecting circuits FCD1 to FCDn, spare cell control circuits SPC1, SPC2, and inverters INV3 to INV8.

An n−1-th shift redundancy circuit SFn−1 receives an n−2-th word line control signal WAn−2, an n−1-th word line control signal WAn−1, an n-th word line control signal WAn, an output signal FSUn−1 of an n−1-th upper fuse FAUn−1, an output signal FSDn−1 of an n−1-th lower fuse FADn−1, a third output signal DSOn of an n-th shift redundancy circuit SFn, a second output signal USOn−2 of an n−2-th shift redundancy circuit SFn−2. Further, an n−1-th shift redundancy circuit SFn−1 outputs a first output signal WBn−1, a second output signal USOn−1, and a third output signal DSOn−1 thereof.

The upper fuse cut-out detecting circuit FCUn−1 receives an output signal FSUn−1 of the upper fuse FAUn−1 and a reset signal RESET, outputs an output signal DSUn−1 and transmits the output signal DSUn−1 to a node Nn−1.

The lower fuse cut-out detecting circuit FCDn−1 receives an output signal FSDn−1 of the lower fuse FADn−1 and a reset signal RESET, outputs an output signal DSDn−1 and transmits the output signal DSDn−1 to the node Nn−1.

A voltage level of the node Nn−1 is inverted by the inverter INV5 and the inverted voltage level serves as an n−1-th final word line control signal WCn−1.

The first spare cell control circuit SPC1 receives a first word line control signal WA1 and a third output signal DSO1 of the first shift redundancy circuit SF1, and generates an output signal WSB1. The output signal WSB1 of the first spare cell control circuit SPC1 is inverted in its voltage level by the inverter INV8, and the inverted signal serves as a first spare cell control signal WSC1. The first spare cell control circuit SPC1 includes a first transmission gate including a first PMOS transistor PM1 and a first NMOS transistor NM1. The first transmission gate receives a first word line control signal WA1 while being controlled by the third output signal DSO1 of the first shift redundancy circuit SF1, the third output signal DSO1 being inputted to a gate electrode of the first PMOS transistor PM1, and transmits the first word line control signal WA1 to an output node of the first spare cell control circuit SPC1. The first spare cell control circuit SPC1 further includes a first inverter INV1 for inverting a voltage level of the input signal of the gate electrode of the first PMOS transistor PM1 and applying the inverted voltage level to a gate electrode of the first NMOS transistor NM1. The first spare cell control circuit SPC1 further includes a third PMOS transistor PM3 connected between the output node of the first spare cell control circuit SPC1 and a power supply voltage line. The third PMOS transistor PM3 has a gate electrode connected to the gate electrode of the first NMOS transistor NM1.

The second spare cell control circuit SPC2 receives the n-th word line control signal WAn and a second output signal USOn of the n-th shift redundancy circuit SFn, and generates an output signal WSB2. The output signal WSB2 of the second spare cell control circuit SPC2 is inverted by the inverter INV3 and the inverted output signal of the second spare cell control circuit SPC2 serves as a second spare cell control signal WSC2. The second spare cell control circuit SPC2 includes a second transmission gate including a second PMOS transistor PM2 and a second NMOS transistor NM2. The second transmission gate receives the n-th word line control signal WAn in response to the second output signal USOn of the n-th shift redundancy circuit SFn, which is input to a gate electrode of the second PMOS transistor PM2, and transmits the n-th word line control signal WAn to an output node of the second spare cell control circuit SPC2. The second spare cell control circuit SPC2 further includes a second inverter INV2 for inverting a voltage level of the input signal of the gate electrode of the second PMOS transistor PM2 and applying the inverted voltage level to a gate electrode of the second NMOS transistor NM2. The second spare cell control circuit SPC2 still further includes a fourth PMOS transistor PM4 which is connected between the output node of the second spare cell control circuit SPC2 and a power supply voltage, and has a gate electrode connected to the gate electrode of the second NMOS transistor NM2.

The shift redundancy circuits SF1 and SFn which may be between the first and second spare cell control circuits SPC1, SPC2, respectively, receive a power supply voltage Vcc and a ground voltage Vss as inputs.

Figure 3:
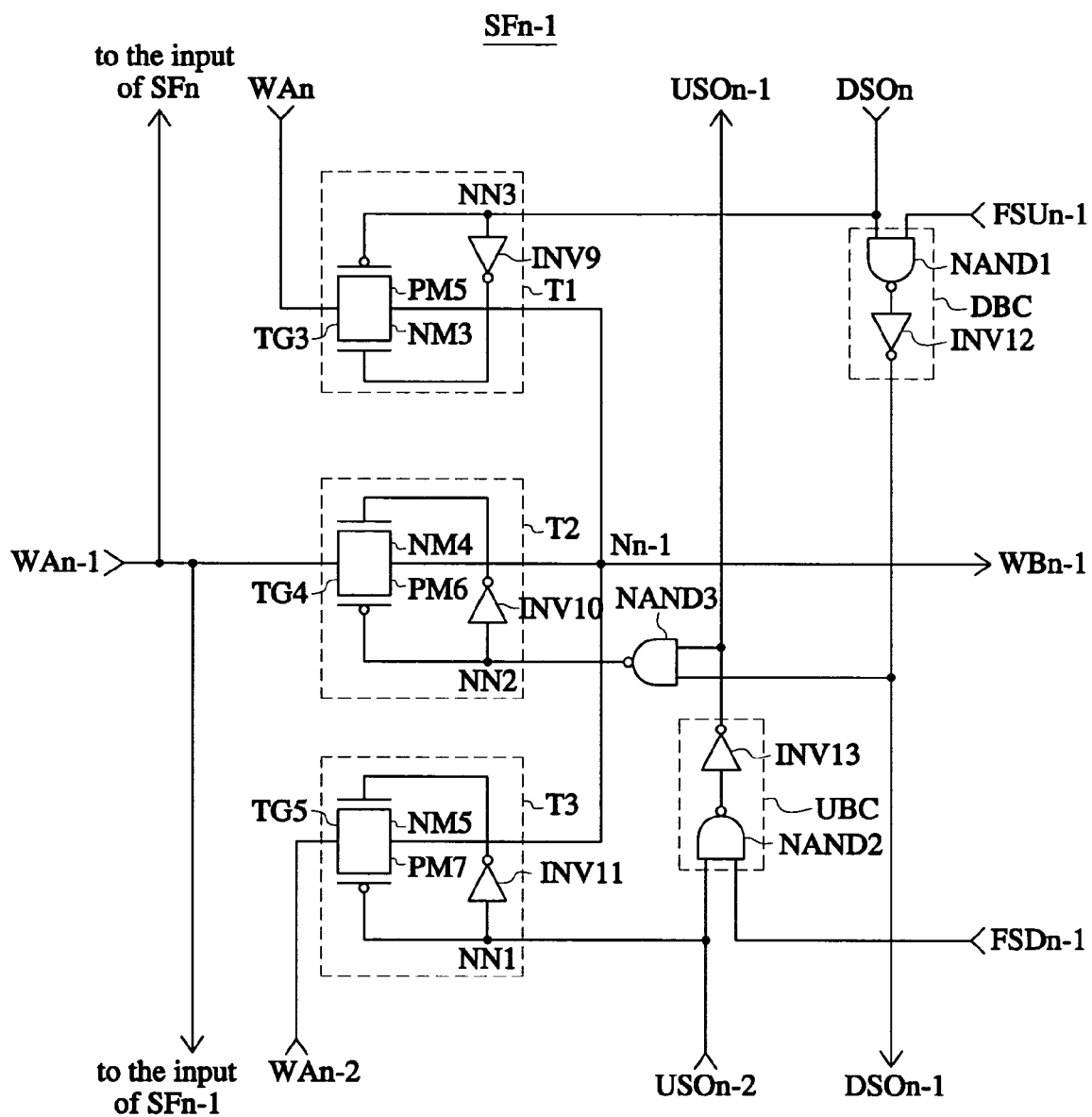
FIG. 3 is an exemplary circuit diagram of a shift redundancy circuit shown in FIG. 2.

FIG. 3 illustrates a shift redundancy circuit shown in FIG. 2, particularly illustrates a detailed circuitry of the n-1-th shift redundancy circuit SFn-1.

Referring to FIG. 3, the shift redundancy circuit SFn-1 includes a first transmission switch T1 for receiving the n-th word line control singal WAn while being controlled by the third output signal DSOn of the n-th shift redundancy circuit SFn and transmitting the received signal to the node Nn-1, a third transmission switch T3 for receiving the n-2-th word line control signal WAn-2 while being controlled by a second output signal USOn-2 of the n-2-th shift redundancy circuit SFn-2 and transmitting the received signal to the node Nn-1, and a downward buffer chain DBC for receiving the third output signal DSOn of the n-th shift redundancy circuit SFn and the output signal FSUn-1 of the upper fuse FAUn-1, logically multiplying the received signals and generating a third output signal DSOn-1 of the n-1-th shift redundancy circuit SFn-1 as a result of the logical multiplication operation. The shift redundancy circuit SFn-1 further includes an upward buffer chain UBC for receiving the second output signal USOn-2 of the n-2-th shift redundancy circuit SFn-2 and the output signal FSDn-1 of the lower fuse FADn-1, logically multiplying the received signals and generating a second output signal USOn-1 of the n-1-th shift redundancy circuit SFn-1. The shift redundancy circuit SFn-1 still further includes a NAND circuit NAND3 for receiving the third output signal DSOn-1 of the n-1-th shift redundancy circuit SFn-1 and the second output signal USOn-1 of the n-1-th shift redundancy circuit SFn-1, performing the NAND operation using the received signals, generating an output signal as a result of the NAND operation and transmitting its output signal to a node NN2. The shift redundancy circuit SFn-1 further includes a second transmission switch T2 for receiving the n-1-th word line control signal WAn-1 in response to the output signal of the NAND circuit NAND3 and transmitting the received word line control signal WAn-1 to the node Nn-1.

The first transmission switch T1 includes a transmission gate TG3 further including a PMOS transistor PM5 and an NMOS transistor NM3, and an inverter INV9 which is connected between a gate electrode of the PMOS transistor PM5 and a gate electrode of the NMOS transistor NM3, inverts the third output signal DSOn of the n-th shift redundancy circuit SFn, and transmits the inverted third output signal to the gate electrode of the NMOS transistor NM3. The second and third transmission switches T2, T3 have the same configurations as the first transmission switch T1.

The downward buffer chain DBC includes a NAND circuit NAND1 for receiving the third output signal DSOn of the n-th shift redundancy circuit SFn and the output signal FSUn-1 of the n-1-th upper fuse FAUn-1 and logically multiplying the received signals, and an inverter INV12 for inverting an output of the NAND circuit NAND1.

The upward buffer chain UBC includes a NAND circuit NAND2 for receiving the second output signal USOn-2 of the n-2-th shift redundancy circuit SFn-2 and the output signal FSDn-1 of the n-1-th lower fuse FADn-1 and logically multiplying the received signals, and an inverter INV13 for inverting the output of the NAND circuit NAND2.

Figure 4A:
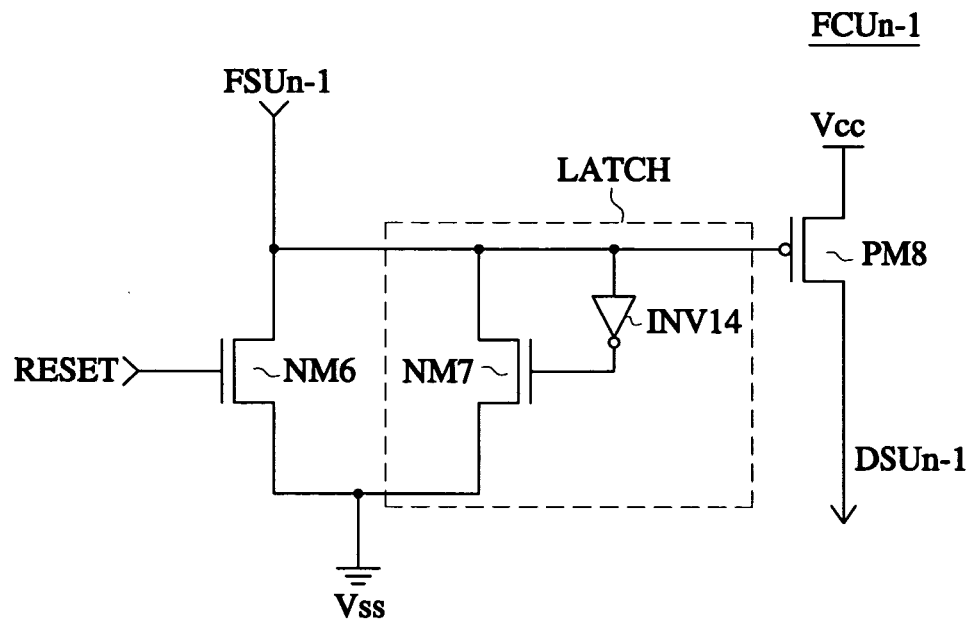
FIG. 4A and FIG. 4B are exemplary circuit diagrams of a fuse cut-out detecting circuit shown in FIG. 2.
Figure 4B:
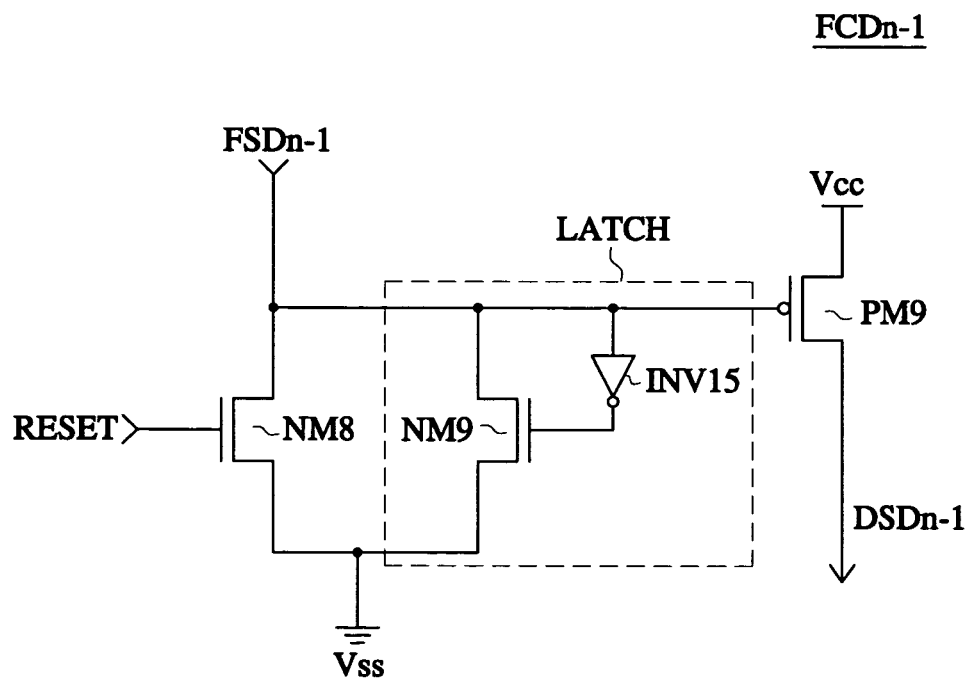

FIGS. 4A and 4B illustrate exemplary circuits of an upper fuse cut-out detecting circuit FCUn-1 and a lower fuse cut-out detecting circuit FCDn-1, respectively. The upper fuse cut-out detecting circuit FCUn-1 includes a PMOS transistor PM8, an NMOS transistor NM6, an inverter INV14 and an NMOS transistor NM7. The PMOS transistor PM8 has a gate electrode to which the output signal FSUn-1 of the upper fuse FAUn-1 is applied, a source electrode to which a power supply voltage Vcc is applied, and a drain electrode from which an output signal DSUn-1 thereof is generated. The NMOS transistor NM6 has a drain electrode connected to the gate electrode of the PMOS transistor PM8, a source electrode to which a ground voltage Vss is applied, and a gate electrode for receiving a reset signal RESET. The inverter INV14 inverts the output signal FSUn-1 of the upper fuse FAUn-1 and outputs the inverted signal of the output signal FSUn-1 of the upper fuse FAUn-1. The NMOS transistor NM7 has a drain electrode connected to the gate electrode of the PMOS transistor PM8, a source electrode to which a ground voltage Vss is applied, and a gate electrode for receiving the output of the inverter INV14. The NMOS transistor NM7 and the inverter INV14 form a latch LATCH.

The lower fuse cut-out detecting circuit FCDn−1 includes a PMOS transistor PM9, an NMOS transistor NM8, an inverter INV15 and an NMOS transistor NM9. The PMOS transistor PM9 has a gate electrode to which an output signal FSDn−1 of a lower fuse FADn−1 is applied, a source electrode to which a power supply voltage Vcc is applied, and a drain electrode from which an output signal DSDn−1 thereof is generated. The NMOS transistor NM8 has a drain electrode connected to the gate electrode of the PMOS transistor PM9, a source electrode to which a ground voltage Vss is applied, and a gate electrode for receiving a reset signal RESET. The inverter INV15 inverts the output signal FSDn−1 of the lower fuse FADn−1 and outputs an inverted output signal having an opposite logic level to the output signal FSDn−1 of the lower fuse FADn−1. The NMOS transistor NM9 has a drain electrode connected to the gate electrode of the PMOS transistor PM9, a source electrode to which a ground voltage Vss is applied, and a gate electrode for receiving the output of the inverter INV15. The NMOS transistor NM9 and the inverter INV15 form a latch LATCH.

The operation of the semiconductor memory device in accordance with the present invention will be described below with reference to FIGS. 2 to 4. For the sake of convenience of the explanation, the operation of an n−1-th shift redundancy circuit SFn−1 receiving an n−1-th word line control signal WAn−1 as an input will be described.

A row decoder 10 decodes n-bit of row addresses and outputs word line control signals WA1 to WAn. Final word line control signals WC1 to WCn, and two spare cell control signals WSC1, WSC2 control 8 memory cell rows in a memory cell array (not shown). A reset signal RESET resets the final word line control signals WC1 to WCn through upper and lower fuse cut-out detecting circuits FCU1 to FCUn, FCD1 to FCDn before the operation of the semiconductor memory device starts.

If there are no defective memory cells in the memory cell array controlled by the final word line control signals WC1 to WCn and repair work of the memory cells is not needed, the upper fuse FAUn−1 and the lower fuse FADn−1 are not cut out, so that their output signals FSUn−1 and FSDn−1 have a logic "high" level. Accordingly, a second transmission switch T2 is turned on and a first and third transmission switches T1, T3 are turned off. In this state, the semiconductor memory device operates as a normal semiconductor memory device with no shift redundancy circuits. That is, word line control signals WA1 to WAn become the corresponding final word line control signals WC1 to WCn, respectively.

However, if there is a defective memory cell in a memory cell row controlled by the n−1-th word line control signal WAn−1, the defective memory cell may be repaired by cutting out either the upper fuse FAUn−1 or the lower fuse FADn−1.

Assuming that only the upper fuse FAUn−1 is cut out, a second output signal USOn−2 of an n−2-th shift redundancy circuit SFn−2, a third output signal DSOn of an n-th shift redundancy circuit SFn and an output signal FSDn−1 of an n−1-th lower fuse FADn−1 have a logic "high" level. Since an output signal FSUn−1 of the upper fuse FAUn−1 has a logic "low" level, the third output signal DSOn−1 of the n−1-th shift redundancy circuit SFn−1 and the third output signal DSOn−1, an output of a downward buffer chain DBC, becomes a logic "low" level. Accordingly, an output of a NAND circuit NAND3 becomes a logic "high" level, and a second transmission switch T2 is turned off. Since, the second output signal USOn−2 of the n−2-th shift redundancy circuit SFn−2 and the third output signal DSOn of the n-th shift redundancy circuit SFn have a logic "high" level, the first and the third transmission switches T1, T3 are turned off. Since the output signal FSUn−1 of the upper fuse FAUn−1 has a logic "low" level, the PMOS transistor PM8 is turned on with reference to FIG. 4A, and an output signal DSUn−1 of an upper fuse cut-out detecting circuit FCUn−1 becomes a logic "high" level. This signal makes a logic state of a node Nn−1 high, so that the n−1-th final word line control signal WCn−1 which is the output of the inverter INV5 becomes logic "low" and the n−1-th word line is disabled. When only the n−1-th upper fuse FAUn−1 is cut out, all the outputs of the downward buffer chains DBC of the shift redundancy circuits SFn−1 to SF1 have a logic "low" level, and only the output of the downward buffer chain DBC of the n-th shift redundancy circuit SFn has a logic "high" level. Further, all the outputs of the upward buffer chains in all the shift redundancy circuits SF1 to SFn have a logic "high" level.

When only the n−1-th upper fuse FAUn−1 is cut out, the operation of the n−2th shift redundancy circuit SFn−2 will be described below.

Since, a logic "low" level of the third output signal DSOn−1 of the n−1-th shift redundancy circuit SFn−1 is applied to the downward buffer chain DBC of the n−2-th shift redundancy circuit SFn−2, a second transmission switch T2 and a third transmission switch T3 of the n−2-th shift redundancy circuit SFn−2 are turned off. The n−2-th shift redundancy circuit SFn−2 is different from the n−1-th shift redundancy circuit SFn−1 in that a logic "low" level of the third output signal DSOn−1 of the n−1-th shift redundancy circuit SFn−1 is input to the first transmission switch T1 of the n−2-th shift redundancy circuit SFn−2, so that the first transmission switch T1 of the n−2-th shift redundancy circuit SFn−2 is turned on and an n−1-th word line control signal WAn−1 is transmitted to an output node Nn−2 (not shown) of the n−2-th shift redundancy circuit SFn−2. Since the n−2-th upper fuse FAUn−2 (not shown) and the n−2-th lower fuse FADn−2 (not shown) are not cut out, the PMOS transistors PM8, PM9 of the upper fuse cut-out detecting circuit FCUn−2 and the lower fuse cut-out detecting circuit FCDn−2 are turned off. Accordingly, the n−1-th word line control signal WAn−1 becomes the n−2-th final word line control signal WCn−2.

In the same manner as described above, the n−1-th final word line control signal WCn−1 is disabled, and the n−2-th final word line control signal WCn−2 to the first final word line control signal WC1 are enabled by the n−1-th word line control signals WAn−1 to the second word line control signal WA2. For the first spare cell control circuit SPC1, the transmission switch TG1 is turned on by a logic "low" level of the third output signal DSO1 of the first shift redundancy circuit SF1, and the first word line control signal WA1 finally serves as a first spare cell control signal WSC1, so that the memory cells connected to the first spare cell control signal WSC1 may be used.

Assuming that only the n−1-th lower fuse FADn−1 is cut out, the second output signal USOn−2 of the n−2-th shift redundancy circuit SFn−2, the third output signal DSOn of the n-th shift redundancy circuit SFn, and the output signal FSDn−1 of the n−1-th upper fuse FAUn−1 have a logic "high" level. Since the output signal FSDn−1 of the lower fuse FADn−1 has a logic "low" level, an output signal of the upper buffer chain UBC, which is a second output signal USOn−1 of the n−1-th shift redundancy circuit SFn−1, becomes a logic "low" level. Accordingly, an output of the NAND circuit NAND3 becomes a logic "low" level, and the second transmission switch T2 is turned off. Since both of the second output signal USOn−2 of the n−2-th shift redundancy circuit SFn−2 and the third output signal DSOn of the n-th shift redundancy circuit SFn have a logic "high" level, the first and the third transmission switches T1, T3 are turned off. Since the output signal FSDn−1 of the lower fuse FADn−1 has a logic "low" level, with reference to FIG. 4B, the PMOS transistor PM9 is turned on and the output signal DSDn−1 of the lower fuse cut-out detecting circuit FCDn−1 has a logic "high" level. This signal makes the node Nn−1 a logic "high" level. Accordingly, the n−1-th final word line control signal WCn−1 which is the output of the inverter INV5 becomes a logic "low" level and the n−1-th word line is disabled. In the case that only the n−1-th lower fuse FADn−1 is cut out, the outputs of the upper buffer chains UBC of the shift redundancy circuits SFn−1, SFn have a logic "low" level, and the outputs of the upper buffer chains UBC of the shift redundancy circuits SFn−2 to SF1 have a logic "high" level. Further, for all the shift redundancy circuit SF1 to SFn, all the outputs of the lower buffer chains have a logic "high" level.

When only the n−1-th upper fuse FAUn−1 is cut out, the operation of the n-th shift redundancy circuit SFn will be described below.

Since a logic "low" level of the second output signal USOn−1 of the n−1-th shift redundancy circuit is applied to the upper buffer chain UBC of the n-th shift redundancy circuit SFn, the second transmission switch T2 and the first transmission switch T1 of the n-th shift redundancy circuit SFn are turned off as those of the n−1-th shift redundancy circuit SFn−1. However, the n-th shift redundancy circuit SFn is different from the n−1-th shift redundancy circuit in that a logic "low" level of the second output signal USOn−1 of the n−1-th shift redundancy circuit SFn−1 is applied to the third transmission switch T3, the third transmission switch T3 of the n-th shift redundancy circuit SFn is turned on and the n−1-th word line control signal WAn−1 is transmitted to the output node Nn of the n-th shift redundancy circuit SFn. Since both of the n-th upper fuse FAUn and the n-th lower fuse FADn are not cut out, the PMOS transistors PM8, PM9 of the upper fuse cut-out detecting circuit FCUn and the lower fuse cut-out detecting circuit FCDn are turned off. Accordingly, the n−1-th word line control signal WAn−1 becomes the n-th final word line control signal WCn.

In the same manner as described above, the n−1-th final word line control signal WCn−1 is disabled and the n−1-th word line control signal WAn−1 becomes the n-th final word line control signal WCn. Further, the n−2-th word line control signal WAn−2 to the first word line control signal WA1 become the n−2-th final word line control signal WCn−2 to the first final word line control signal WC1, respectively. For the second spare cell control circuit SPC2, the transmission switch TG2 thereof is turned on by a logic "low" level of the second output signal USOn of the n-th shift redundancy circuit SFn, and the n-th word line control signal WAn is used as the second spare cell control signal WSC2, so that the spare memory cell row connected to the spare cell control signal WSC2 may be used.

When both of the n−1-th upper and lower fuses FAUn−1, FADn−1 are cut out, since downward shift operation of the word line control signals may be performed by the downward buffer chains and upward shift operation of the word line control signals may be performed by the upward buffer chains, the semiconductor memory device may be repaired even when the semiconductor memory device has two defective memory cell rows in the same memory cell array block.

Figure 5A:
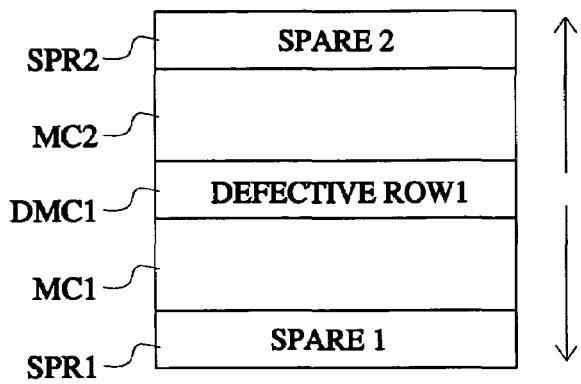
FIGS. 5A to 5C are exemplary layouts of semiconductor memory devices in accordance with exemplary embodiments of the present invention, wherein the semiconductor memory device has two spare memory cell rows.
Figure 5B:
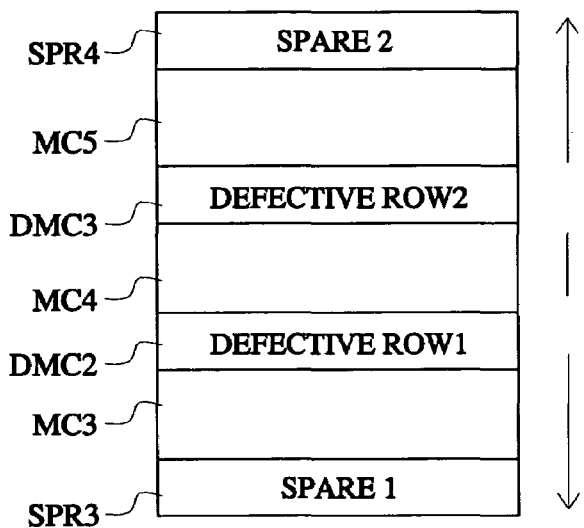
Figure 5C:
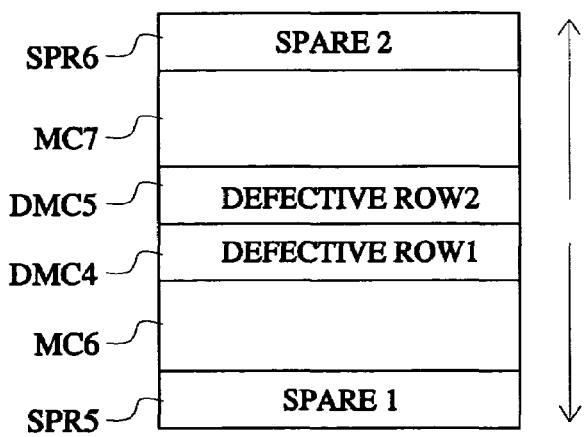

FIGS. 5A to 5C illustrate the repair operation of the semiconductor memory device in accordance with an exemplary embodiment of the present invention.

Referring to FIG. 5A, a memory cell array has a defective memory cell row. At this time, word line control signals are shifted in one direction, upward or downward, by cutting out the upper fuse or the lower fuse, as described above.

Referring to FIG. 5B, a memory cell array has two defective memory cell rows which are separate from each other. As shown, the memory cell array is divided into three memory cell array blocks MC3, MC4, MC5.

In a memory cell array block MC3, word line control signals are shifted downward, and an upper fuse corresponding to the defective memory cell row DMC2 is cut out. On the other hand, a memory cell array block MC4 performs a normal operation and word line control signals are not shifted in the memory cell array block MC4. In a memory cell array block MC5, word line control signals are shifted upward and a lower fuse corresponding to the defective memory row DMC3 is cut out.

Referring to FIG. 5C, a memory cell array has two defective memory cell rows which are adjacent to each other. At this time, the memory cell array is divided into two memory cell array blocks MC6, MC7. The memory cell array block MC6 performs a downward shift operation, an upper fuse corresponding to the defective memory cell row DMC4 is cut out, and the memory cell array block MC7 performs an upward shift operation and a lower fuse corresponding to the defective memory cell row DMC5 is cut out.

Accordingly, even if the defective memory cell rows are located at any place in a memory cell array, the defective memory cell rows can be repaired.

Figure 6A:
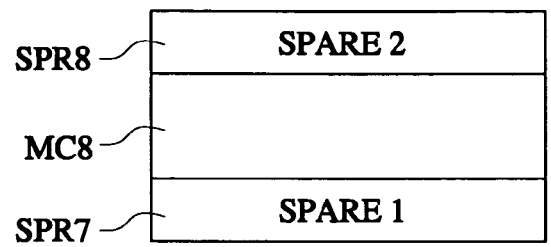
FIGS. 6A to 6C are exemplary layouts of semiconductor memory devices in accordance with exemplary embodiments of the present invention, wherein the semiconductor memory devices have different numbers of spare memory cell rows.
Figure 6B:
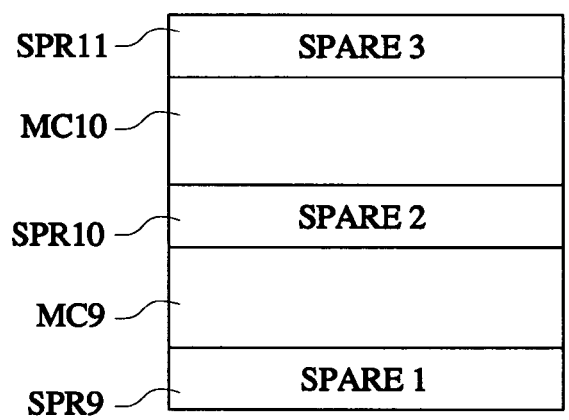
Figure 6C:
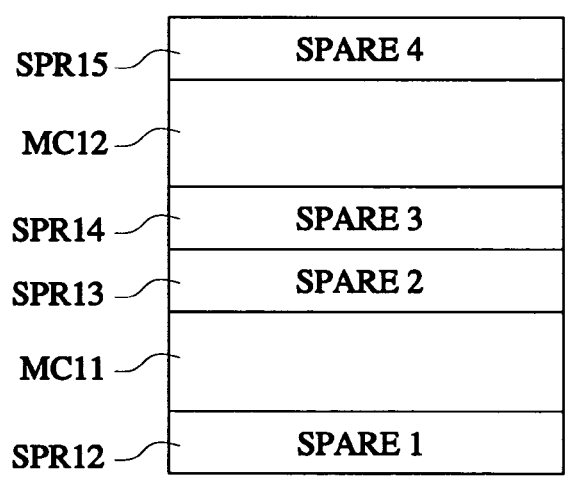

FIGS. 6A to 6C illustrate examples of the arrangements of spare memory cell rows in accordance with an exemplary embodiment of the present invention.

Referring to FIG. 6A, a semiconductor memory device has two spare memory cell rows SPR7, SPR8 in a memory cell array, and they are arranged at the lowermost portion and the uppermost portion of a memory cell array, respectively. In this case, word line control signals are shifted either upward or downward, so that at least two defective memory cell rows can be repaired.

Referring to FIG. 6B, a semiconductor memory device has three spare memory cell rows SPR9, SPR10, SPR11 which are located at the lowermost, middle and uppermost portions, respectively, of a memory cell array. If a semiconductor memory device with three spare memory cell rows has a total three defective memory cell rows anywhere in the memory cell array, and each memory cell array block in the memory cell array has two or fewer defective rows, the semiconductor memory device can be repaired. For example, if a memory cell array block MC9 has two defective memory cell rows and a memory cell array block MC10 has a defective memory cell row, one of the defective memory cell rows in the block MC9 is repaired by using the spare memory cell row SPR9 by a downward shift operation of word line control signals and the other defective memory cell row in the block MC9 is repaired by using the spare memory cell row SPR10 by an upward shift operation of word line control signals, and further the defective memory cell row in the memory cell array block MC10 is replaced with the spare memory cell row SPR11 by an upward shift operation of word line control signals.

Referring to FIG. 6C, a semiconductor memory device has four spare memory cell rows SPR12, SPR13, SPR14 and SPR15 in a memory cell array. Two spare rows SPR12, SPR15 are arranged in the lowermost and uppermost portions of the memory cell array, respectively, and the other two SPR13, SPR14 are arranged in the middle portion of the memory cell array adjacent to each other. If the semiconductor memory device has a total four defective memory cell rows anywhere in the memory cell array, and each memory cell array block in the memory cell array has two or defective memory cell rows, the semiconductor memory device can be repaired. For example, if memory cell array blocks MC11, MC12 have two defective memory cell rows therein, respectively, one of the defective memory cell rows in the memory cell array block MC11 is replaced with the spare memory cell row SPR12 by a downward shift operation of word line control signals and the other in the block MC11 is replaced with the spare memory cell row SPR13 by an upward shift operation of word line control signals, and further one of the defective memory cell rows in the memory cell array block MC12 is replaced with the spare memory cell row SPR14 by a downward operation of the word line control signals and the other in the block MC12 is replaced with the spare memory cell row SPR15 by an upward operation of the word line control signals.

As described above, exemplary embodiments of the present invention provide a semiconductor memory device allowing two or more defective memory cell rows in the same memory cell array block to be repaired by using spare memory cell rows. Further, the semiconductor memory devices in accordance with exemplary embodiments of the present invention are advantageous in that leakage current generated by fuse resistance is reduced and malfunction of the semiconductor memory device is reduced.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:
   at least two shift redundancy circuits with at least two buffer chains;
   at least two fuses connected to each of the shift redundancy circuit;
   at least two fuse cut-out detecting circuits connected to each of the shift redundancy circuits for detecting cut-out status of the fuses; and
   at least two spare cell control circuits for controlling at least two spare memory cell rows,
   wherein word line control signals for controlling corresponding word lines connected to memory cells in a memory cell array are shifted upward or downward, thereby replacing at least two defective memory cell rows with the at least two spare memory cell rows.

2. A semiconductor memory device with first to n-th shift redundancy circuits, including:
   a row decoder for generating a plurality of word line control signals;
   a plurality of shift redundancy circuits for receiving at least three word line control signals of the word line control signals, and transmitting at least one word line control signal among the received three word line control signals;
   a plurality of upper fuses and a plurality of lower fuses, each connected between a power supply voltage and a corresponding shift redundancy circuits;
   a plurality of upper and lower fuse cut-out detecting circuits, reset by a reset signal, each of which receives an output of either a corresponding upper fuse or a corresponding lower fuse, and enables or disables respective outputs of a corresponding shift redundancy circuits;
   a first spare cell control circuit for receiving a first word line control signal and a third output signal of the first shift redundancy circuit, and generating a first spare cell control signal;
   a second spare cell control circuit for receiving an n-th word line control signal and a second output signal of the n-th shift redundancy circuit, and generating a second spare cell control signal; and
   a plurality of inverters, each connected to a respective output terminal of a corresponding shift redundancy circuit and connected to an output terminal of the first and second spare cell control circuits, for inverting voltage levels of the output terminals and outputting corresponding final word line control signals.

3. The semiconductor memory device as set forth in claim 2, wherein each shift redundancy circuit of the shift redundancy circuits includes:
   a first transmission switch for receiving an upper word line control signal among three word line control signals in response to a third output signal of an upper shift redundancy circuit and transmitting the upper word line control signal to a first node;
   a third transmission switch for receiving a lower word line control signal among three word line control signals in response to a second output signal of a lower shift redundancy circuit and transmitting the lower word line control signal to the first node;
   a downward buffer chain for receiving the third output signal of the upper shift redundancy circuit and an output signal of the upper fuse, logically multiplying the received signals, and outputting a result of the logical multiplication operation as a corresponding third output signal;
   an upward buffer chain for receiving a second output signal of the lower shift redundancy circuit and an output signal of the lower fuse, logically multiplying the received signals and outputting a result of the logical multiplication operation as a corresponding second output signal;
   a first NAND circuit for receiving the corresponding third output signal and the corresponding second output signal, and NANDing the received signals; and
   a second transmission switch for receiving a corresponding word line control signal in response to an output of the first NAND circuit and transmitting the corresponding word line control signal to the first node.

4. The semiconductor memory device as set forth in claim 3, wherein each of the first to third transmission switches includes:
   a third transmission gate; and
   an inverter connected to the third transmission gate in parallel.

5. The semiconductor memory device as set forth in claim 3, each of the upward and downward buffer chains includes:
   a second NAND circuit; and
   an inverter serially connected to the second NAND circuit, wherein the upward and downward buffer chains perform the logical multiplication operation.

6. The semiconductor memory device as set forth in claim 2, each of the plurality of fuse cut-out detecting circuits includes:
an eighth PMOS transistor having a gate electrode to which an output signal of the upper fuse is applied, a source electrode to which a power supply voltage is applied and a drain electrode from which an output signal of the detecting circuit is generated;
a sixth NMOS transistor having a drain electrode connected to a gate electrode of the eighth PMOS transistor and a source electrode connected to a ground voltage, wherein the sixth NMOS transistor performs switching operations in response to a reset signal, and
a latch circuit connected between the gate electrode of the eighth PMOS transistor and the ground voltage for keeping a voltage level of the gate electrode of the eighth PMOS transistor with logic "low" when the output signal of the upper fuse has a logic "low" level.

7. The semiconductor memory device as set forth in claim 6, wherein the latch circuit includes:
a seventh NMOS transistor connected between the gate electrode of the eighth PMOS transistor and the ground voltage; and
an inverter for inverting a voltage level input to the gate electrode of the eighth PMOS transistor and transmitting the inverted voltage level of the gate electrode of the eighth PMOS transistor to the gate electrode of the seventh NMOS transistor.

8. The semiconductor memory device as set forth in claim 2, wherein each of the lower fuse cut-out detecting circuits includes:
a ninth PMOS transistor having a gate electrode to which an output signal of the lower fuse is applied, a source electrode to which a power supply voltage is applied, and a drain electrode from which an output signal of the detecting circuit is generated;
an eighth NMOS transistor having a drain electrode connected to the gate electrode of the ninth PMOS transistor and a source electrode to which a ground voltage is applied, wherein the eighth NMOS transistor performs switching operations in response to a reset signal; and
a latch circuit connected between the gate electrode of the ninth PMOS transistor and the ground voltage for keeping a voltage level of the gate electrode of the ninth PMOS transistor with logic "low" when the output signal of the lower fuse has a logic "low" level.

9. The semiconductor memory device as set forth in claim 8, wherein the latch circuit includes:
a ninth NMOS transistor connected between the gate electrode of the ninth PMOS transistor and the ground voltage; and
an inverter for inverting a voltage level of an input signal of the gate electrode of the ninth PMOS transistor and transmitting the inverted voltage level to a gate electrode of the ninth NMOS transistor.

10. The semiconductor memory device as set forth in claim 2, wherein the first spare cell control circuit includes:
a first transmission gate including a first PMOS transistor and a first NMOS transistor, for receiving the first word line control signal by being controlled by the third output signal of the first shift redundancy circuit, the third output signal being input to a gate electrode of the first PMOS transistor, and transmitting the first word line control signal to an output node of the first spare cell control circuit;
a first inverter for inverting a voltage level of the gate electrode of the first PMOS transistor and applying the inverted voltage level to a gate electrode of the first NMOS transistor; and
a third PMOS transistor connected between the output node of the first spare cell control circuit and a power supply voltage, and having a gate electrode connected to the gate electrode of the first NMOS transistor.

11. The semiconductor memory device as set forth in claim 2, the second spare cell control circuit includes:
a second transmission gate including a second PMOS transistor and a second NMOS transistor, for receiving the n-th word line control signal while being controlled by the second output signal of the n-th shift redundancy circuit, wherein the second output signal is input to a gate electrode of the second PMOS transistor, and transmitting the received n-th word line control signal to an output node of the second spare cell control circuit;
a second inverter for inverting a voltage level of the gate electrode of the second PMOS transistor and transmitting the inverted voltage level to a gate electrode of the second NMOS transistor; and
a fourth PMOS transistor connected between the output node of the second spare cell control circuit and a power supply voltage, and having a gate electrode connected to the gate electrode of the second NMOS transistor.

* * * * *